United States Patent [19]
Abras

[11] Patent Number: 5,947,136
[45] Date of Patent: Sep. 7, 1999

[54] CATCH CUP CLEANING SYSTEM

[75] Inventor: Alexei Abras, San Jose, Calif.

[73] Assignee: Silicon Valley Group Inc., San Jose, Calif.

[21] Appl. No.: 08/707,932

[22] Filed: Sep. 10, 1996

[51] Int. Cl.⁶ .................................................. B08B 3/02
[52] U.S. Cl. ...................... 134/104.1; 134/198; 134/902; 239/222
[58] Field of Search .................... 134/902, 104.1, 134/198; 239/222, 223, 224, 215, 222.11; 118/302, 52

[56] References Cited

U.S. PATENT DOCUMENTS

| | | |
|---|---|---|
| 1,655,932 | 1/1928 | Wreesmann . |
| 1,759,629 | 5/1930 | Riley . |
| 2,368,049 | 1/1945 | Stratford . |
| 2,602,002 | 7/1952 | Schutt .................................. 239/222 |
| 2,709,110 | 5/1955 | Schmidt . |
| 2,917,241 | 12/1959 | Waldrum ............................ 239/222 |
| 2,986,338 | 5/1961 | Foster ................................. 239/222 |
| 3,103,311 | 9/1963 | Kempf . |
| 3,233,655 | 2/1966 | Graham . |
| 3,355,106 | 11/1967 | Graham ............................... 239/222 |
| 3,719,168 | 3/1973 | Kazee .................................. 239/222 |
| 3,950,184 | 4/1976 | Adams et al. ....................... 134/902 |
| 4,174,362 | 11/1979 | Rahman . |
| 4,674,521 | 6/1987 | Paulfus ................................ 134/902 |
| 5,312,487 | 5/1994 | Akimoto et al. .................... 118/302 |
| 5,591,262 | 1/1997 | Sago et al. .......................... 134/902 |

FOREIGN PATENT DOCUMENTS

| | | | |
|---|---|---|---|
| 1514415 | 10/1989 | U.S.S.R. | ................ 239/222 |

*Primary Examiner*—Frankie L. Stinson
*Attorney, Agent, or Firm*—Wilson Sonsini Goodrich & Rosati; Robert Moll

[57] ABSTRACT

The present invention provides a cleaning system. In one embodiment, the system includes a rotating member, a rinse member held to the rotating member, including a channel extending from an inner location to an outer edge of the rinse member for delivery of cleaning fluid through the channel during rotation of the rinse member. The system also includes a cover, disposed on the rinse member, including an opening for cleaning fluid, and a member for dispensing cleaning fluid to the rinse member. In another embodiment, the cleaning system includes an integral rinse member held to the rotating member.

11 Claims, 7 Drawing Sheets

SECTION A-A

CATCH CUP CLEANING SYSTEM

BACKGROUND

The present invention relates to semiconductor manufacturing equipment and particularly to a cleaning system for spin stations used to apply photoresist to semiconductor wafers.

An integrated circuit may contain millions of circuit elements which cannot be fabricated by any physical tool. Instead, the photolithography process—using optical images and a photosensitive film called photoresist—is used to produce the desired circuit patterns on the semiconductor wafer. The process requires one or more applications of the photoresist (resist) to the wafer to be selectively exposed. As shown in FIG. 1, a spin station 2 is used to apply the resist on the surface of the wafer by dispensing the resist on the wafer and then spinning the wafer at high rpm. The spin station 2 typically includes a member such as a spin chuck 10 for holding and rotating the wafer W and a spindle 16 connected to a motor (not shown) for rotating the spin chuck 10. The spin station 2 also includes a catch cup consisting of, for example, a top 12, a bottom 14, and a shield 18 for housing the wafer W on the spin chuck 10, and a dispensing member such as a nozzle 20 for applying the resist to the wafer W. During the spin-coating process, the spinning of the chuck 10 quickly rotates the wafer W to a high rpm, which spreads the resist across the surface of the wafer and rids the excess resist off the wafer by centrifugal force.

Clean air is directed through the spin station 2 to control the temperature and humidity of the environment in the catch cup. Because the resist typically includes a high concentration of volatile solvents, the resist will quickly dry and adhere to the inner walls of the catch cup before it can drain from the bottom 14 of the catch cup. The resist will deposit on the inner walls of the top 12, the bottom 14, and the shield 18 of the catch cup. After even a few processing cycles, excessive amounts of resist can begin to accumulate on the inner walls of the catch cup. This build up of resist on the inner walls of the catch cup can alter the desired air flow characteristics around the wafer and can lead to wafer contamination and poor coating uniformity.

In an attempt to avoid these types of problems, semiconductors manufacturers have removed the catch cup from the spin station and manually applied cleaning fluids to the contaminated inner surfaces of the catch cup. However, this is a labor intensive operation and removes the spin station from production for a long period of time. Other manufacturers have attempted to clean the catch cup by rotating the catch cup while a cleaning nozzle, fixed in position relative to the rotating catch cup, dispenses cleaning fluid or solvent on the contaminated inner walls of the catch cup. Rotating the catch cup, however, increases the complexity of the spin station by requiring that the catch cup which was formerly stationary now rotate for cleaning and be driven by an additional motor.

Others have attempted to avoid these problems by providing a cleaning system as shown in FIG. 2. In this system, a plate 27 is placed on a spin chuck 26 and a set of backside edge bead removal nozzles 28 provided below the plate 27 to supply cleaning fluid to the bottom edge of the plate 27. During the spinning of the spin chuck 26, the cleaning fluid exits the plate 27 through a set of holes 21 arranged at various angles with respect to the plate 27 to direct cleaning fluid to the inner walls of the catch cup top 30. Because the holes 21 are arranged at different angles with respect to the direction of the cleaning fluid exiting the nozzle 28, the velocity in which the cleaning fluid exits the plate 27 is not uniform. The centrifugal force favors the fluid direction which is planar to the plate 27. This leads to inadequate cleaning of the inner wall of the catch cup top 30 and no cleaning of the outer wall of the catch cup shield 32. The inability of the cleaning fluid to reach the catch cup shield 32 then requires that the catch cup be removed and manually cleaned. Because the distance from where the cleaning fluid enters and exits the plate 27 is very small, and because the fluid relies only on the centrifugal force of the spin chuck 26, the cleaning fluid velocity and pressure is not high enough to effectively remove the resist on all the desired surfaces. This requires the spindle 29 to move up and down during the cleaning operation in an attempt to reach all of the inner surfaces of the catch cup.

Another attempt to solve these types of problems includes injecting cleaning fluid into the catch cup through small holes in the top of the catch cup so that cleaning fluid drips down the inner walls of the catch cup before the wafer is coated with resist in an attempt to prevent the resist from ever adhering to the walls of the catch cup. Another attempt uses multiple high pressure jets to supply cleaning fluid without the use of the rotating plate. Either of these attempts use large amounts of cleaning fluid and some customers consider the high pressurized system necessary for jetting the cleaning fluid as inherently unsafe.

It would be highly desirable to provide a catch cup cleaning system which can be used with a variety of spin stations, is highly automated, is capable of directing cleaning fluid at all of the areas where resist builds up in the catch cup, does not require removal of the catch cup, takes advantage of existing components in the spin station, and reduces the consumption of the cleaning fluid.

SUMMARY OF INVENTION

The present invention provides a cleaning system. In one embodiment, the system includes a rotating member, a rinse member held to the rotating member, a channel for delivery of cleaning fluid through the channel during rotation of the rinse member, a cover on the rinse member, including an entry for cleaning fluid, and a member for dispensing cleaning fluid to the rinse member. In another embodiment, the rinse member and cover are an integral rinse member.

DETAILED DESCRIPTION OF THE PREFERRED EMBODIMENTS

The following description includes the best mode of carrying out the invention. This description is made for the purpose of illustrating the general principles of the invention and should not be taken in a limiting sense. The scope of the invention is best determined by reference to the appended claims.

Figure 3:
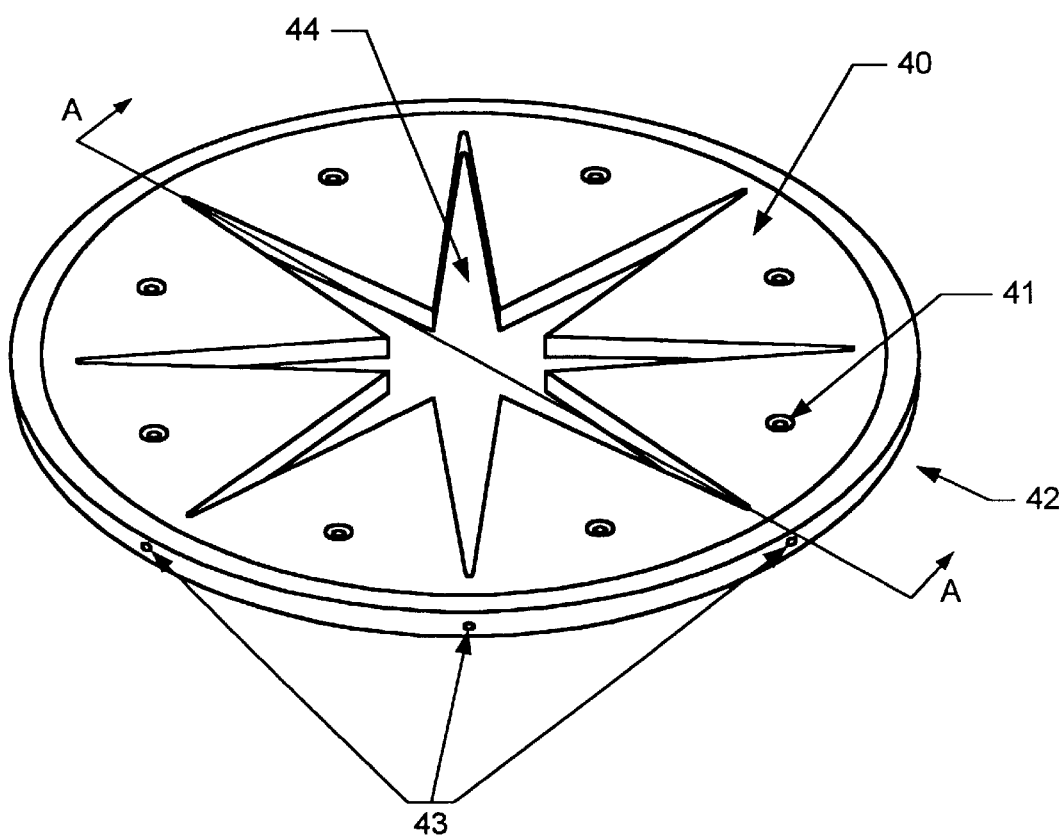
FIG. 3 is a perspective drawing of a rinse member with a sealing gasket having a set of star-shaped channels for delivery of cleaning fluid during rotation of the rinse member.

FIG. 3 illustrates a preferred embodiment of a rinse member 42 with a sealing gasket 40 having a set of star-shaped channels 44 for delivery of cleaning fluid during rotation of the rinse member 42. The rinse member 42 can be manufactured from a variety of materials such as teflon or polypropylene as long as they are chemically compatible with the cleaning fluid, and fabricated using a variety of methods such as machining, molding, and casting.

Figure 1:
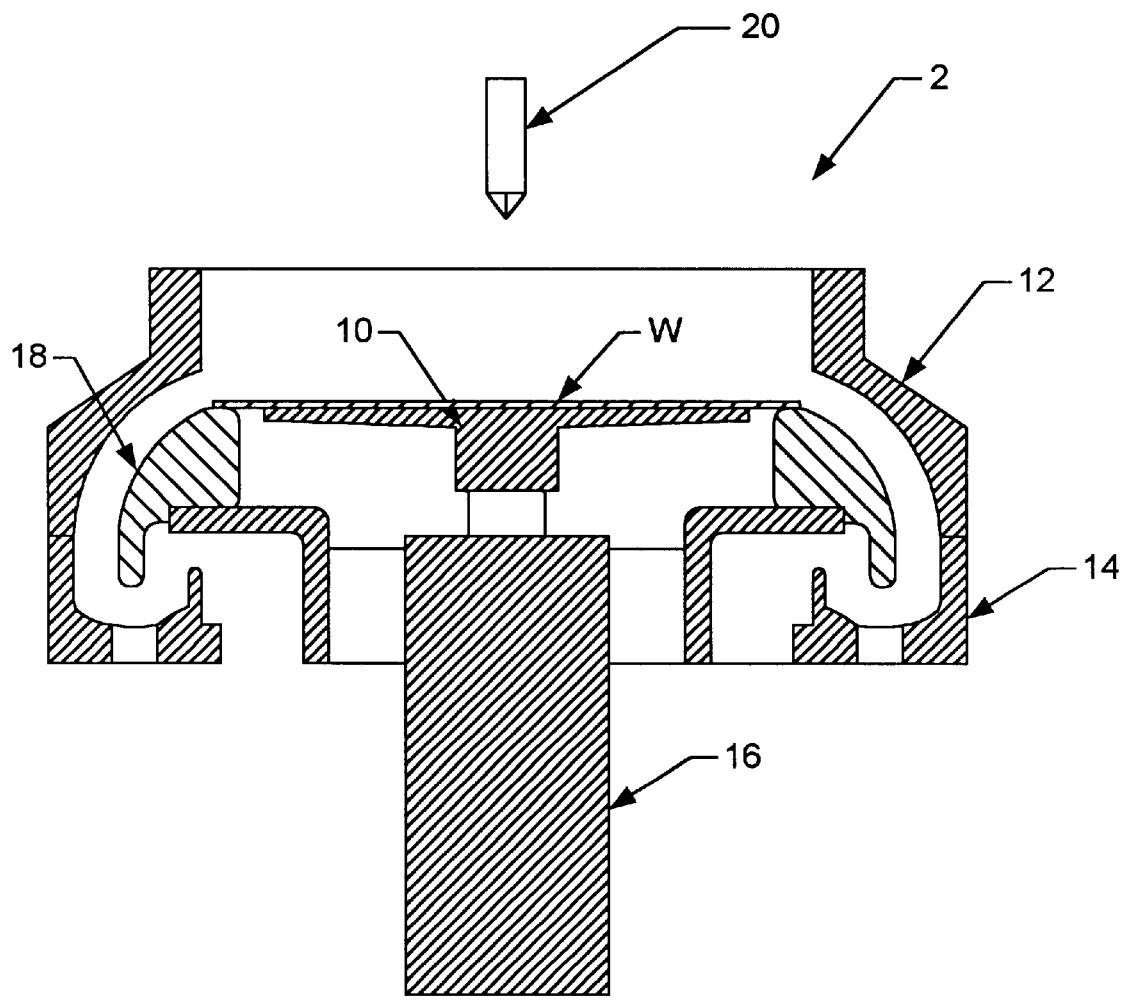
FIG. 1 is a cross-sectional drawing of a spin chuck used to rotate a rinse member within a catch cup.
Figure 2:
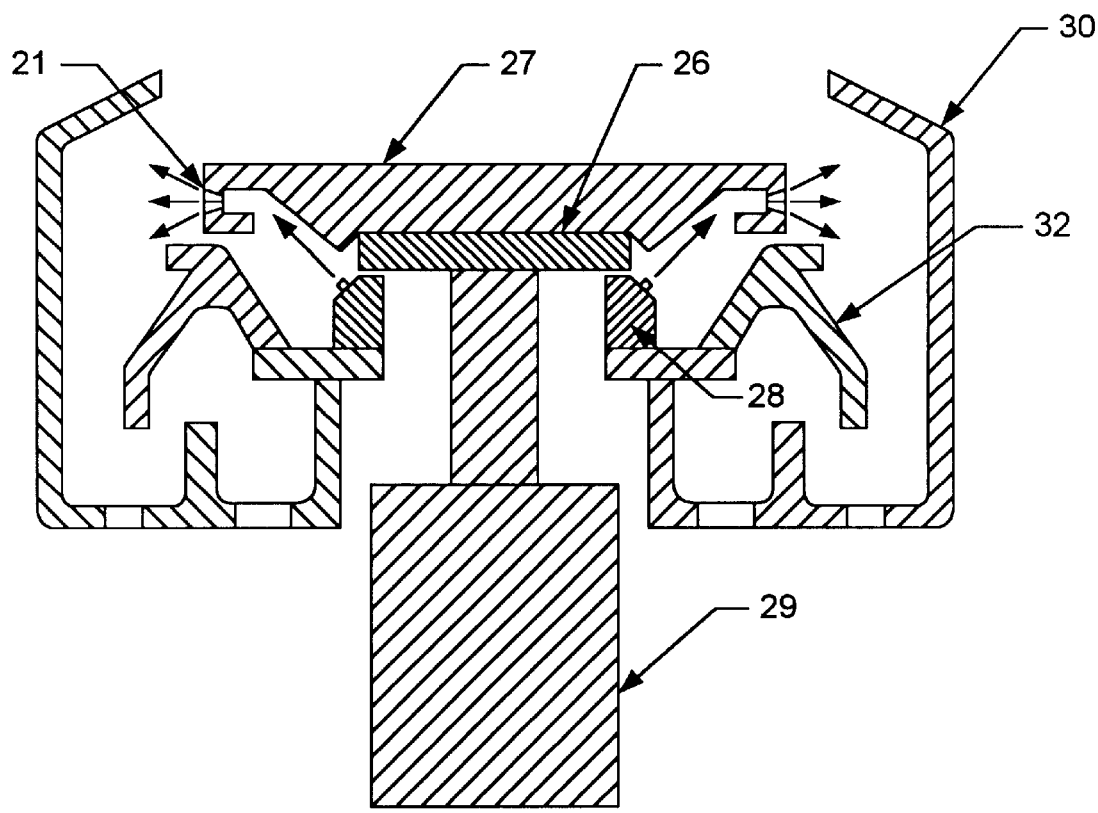
FIG. 2 is a cross-sectional drawing of an approach for cleaning the catch cup of a spin station, including a plate and a set of backside edge bead removal nozzles.

In a preferred embodiment, the rinse member 42 shown in FIG. 3 is disk-shaped member and of approximately the same diameter as the semiconductor wafers being coated with resist. This allows the rinse member 42 to be transported to a spin chuck 10 such as shown in FIG. 1 by the same robotic arm (not shown) used to transfer the wafer W to the spin station during the resist coating operation. Another advantage is the preferred embodiment does not require additional parts beyond the rinse member and cover than that provided in the spin station 2 shown in FIG. 1. In operation, the rinse member 42 is merely placed on the spin chuck 10 by the robotic arm instead of the wafer W, the member 20 dispenses cleaning fluid to the rinse member 42, and the spindle 16 rotates the rinse member 42 to apply the cleaning fluid to the top 12, bottom 14, and shield 18. Therefore, the cleaning of the catch cup can be automated without the need for additional parts, and applied to any spin station able to accomodate a wafer W of the same diameter. The preferred embodiment clearly provides more flexibility in this latter respect because the plate 27 of the cleaning system illustrated in FIG. 2 imposes specific size requirements on the spin chuck 26.

Figure 7:
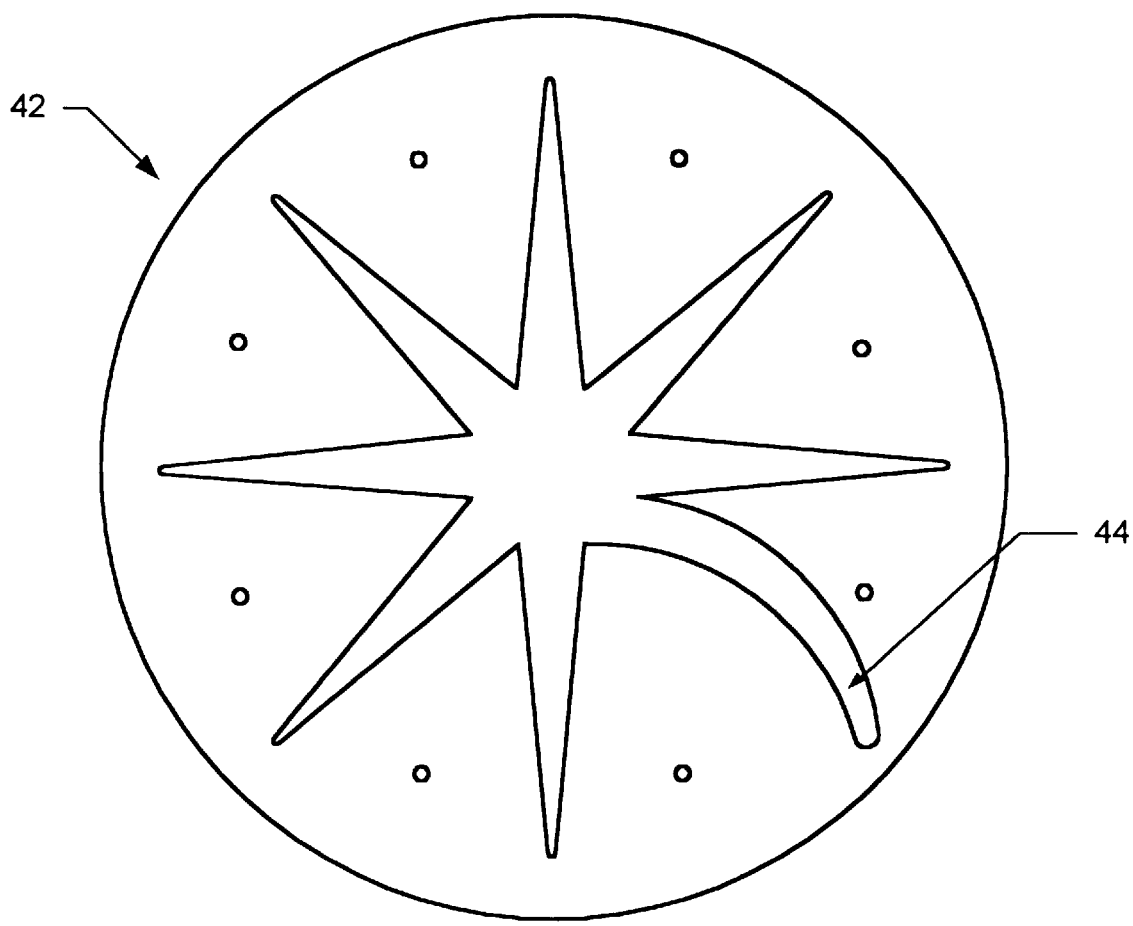
FIG. 7 is a top view of a rinse member having at least one spiral-shaped channel for delivery of cleaning fluid during rotation of the rinse member.

As shown in FIG. 3 in a preferred embodiment, a channel 44 in the rinse member 42 decreases in cross-sectional area from an inner location, e.g., in the vicinity of the center, to the outer edge of the rinse member 42. This reduction in cross-sectional area increases the velocity of the cleaning fluid exiting from the openings 43 in the rinse member 42. In another embodiment shown in a top view in FIG. 7, the rinse member 42 includes a spiral-shaped channel 44 to illustrate another shape suitable for use in the set of channels 44. It should be apparent that one or more of the channels 44 can be spiral-shaped. In these embodiments, however, it is still preferred that the channels 44 decrease in cross-sectional area.

Figure 4:
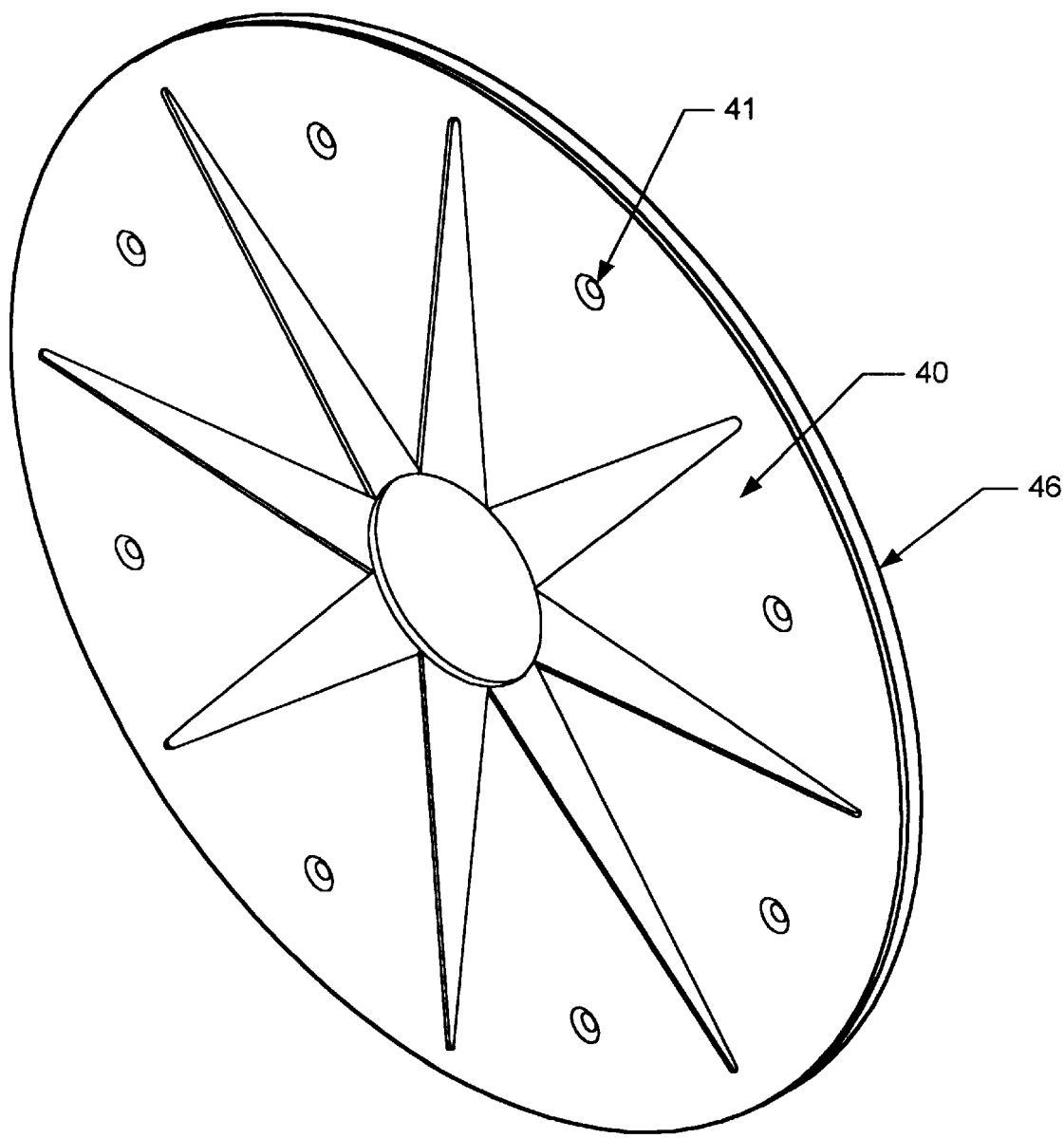
FIG. 4 is a perspective view of a cover with a sealing gasket for attachment to the rinse member.

Referring again to FIG. 3, the gasket 40 provides a seal between the rinse member 42 and a cover 46 shown in FIG. 4. This cover 46 prevents any cleaning fluid from leaking outside the channels 44 during the rotation of the rinse member 42. The gasket 40 may be manufactured from a variety of materials which are chemically compatible with the cleaning fluid such as teflon or Kalrez, and may be bonded to either the rinse member 42 or the cover 46. FIG. 4 illustrates the gasket 40 attached to the cover 46. An O-ring or direct bonding of the cover 46 to the rinse member 42 can be implemented instead of the gasket 40 to provide the seal. The cover 46 can be fastened to the rinse member mechanically, as shown by the bolt holes 41 or through a suitable bonding substance which is chemically compatible with the cleaning fluid.

Figure 5:
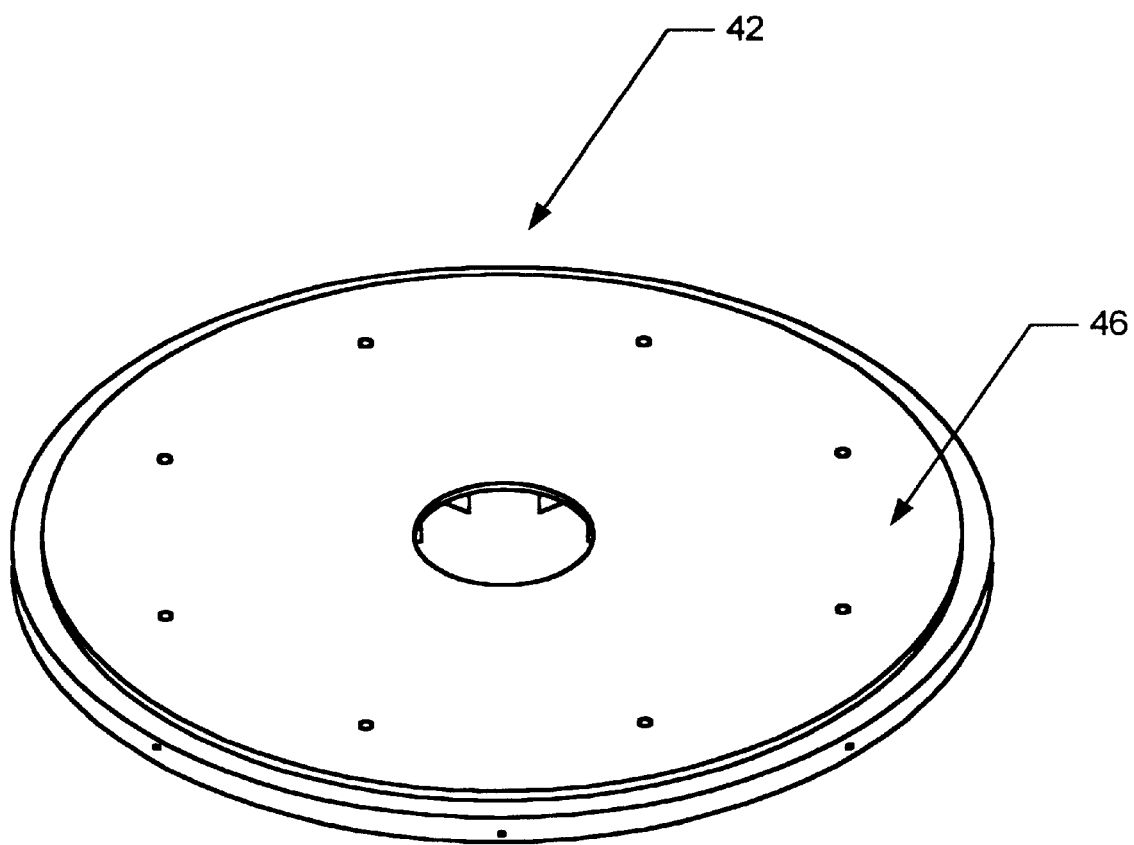
FIG. 5 is a top view of the cover secured to the rinse member.

FIG. 5 illustrates an isometric view of the cover 46 secured to the rinse member 42. The cleaning fluid dispensed onto the rinse member 42 exits the channels 44 shown in FIG. 3 through various openings at different angles to assure that all surfaces of the catch cup components, including the top 12, bottom 14, and shield 18, are cleaned without the need to move the spindle 16 of FIG. 1. In another embodiment, the cover 46 and rinse member 42 are one integral member rather than two separate parts. In the description of the present invention, we will refer to this particular embodiment as an integral rinse member which can be fabricated by injection molding.

Figure 6:
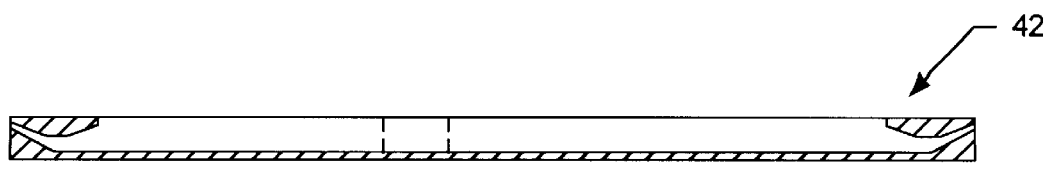
FIG. 6 is a cross-sectional drawing of a rinse member along the section A—A shown in FIG. 3.

FIG. 6 is a cross-sectional drawing of the rinse member 42 along section A—A as shown in FIG. 3. At the edge of the rinse member 42 is a set of openings 43 where the cleaning fluid exits during the cleaning operation.

Figure 6A:
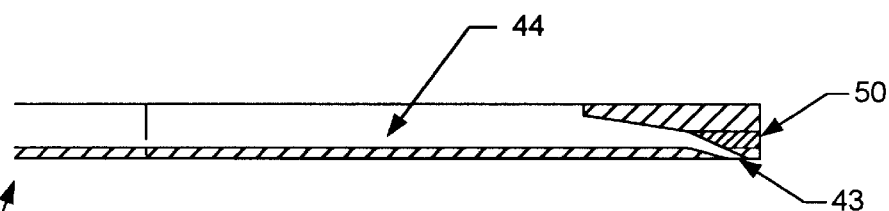
FIG. 6A is a cross-sectional drawing of the outer edge of the rinse member illustrating an opening for directing the cleaning fluid downward with respect to the plane of the rinse member.

FIG. 6A is an enlarged cross-sectional drawing of the outer edge of the rinse member 42 illustrating an opening 43 directing the cleaning fluid downward with respect to the plane of the rinse member 42. The downward opening angle directs the cleaning fluid to the shield 18 (FIG. 1). In one embodiment, the openings 43 shown in FIG. 6A can be fabricated by drilling a first hole at the end of channel 44 of the rinse member 42, then drilling a second hole at an angle which intersects the first hole, and then inserting a plug 50 into the first hole at the outer edge of the rinse member 42. In an alternative embodiment, the openings 43 can be also fabricated by either an injection or compression molding process.

Figure 6B:
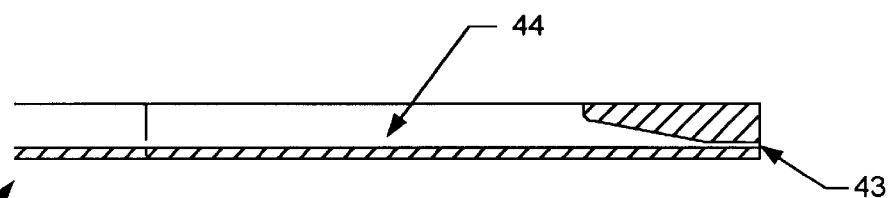
FIG. 6B is a cross-sectional drawing of the outer edge of the rinse member illustrating an opening directing the cleaning fluid within the plane of the rinse member.

FIG. 6B is an enlarged cross-sectional drawing of the outer edge of the rinse member 42 illustrating an opening 43 to channel 44 which directs the cleaning fluid within the plane of the rinse member 42. The openings 43 can be fabricated by forming a tapering hole by a combination of drilling and grinding in the plane of the rinse member 42, or again by either an injection or compression molding process.

Figure 6C:
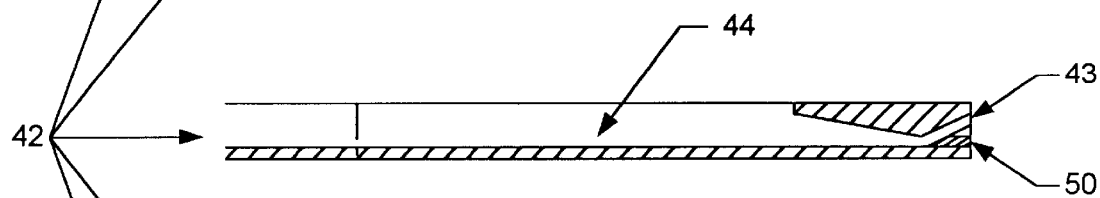
FIG. 6C is a cross-sectional drawing of the outer edge of the rinse member illustrating an opening directing the cleaning fluid upward.

FIG. 6C is an enlarged cross-sectional drawing of the outer edge of the rinse member 42 illustrating an opening 43 to channel 44 which directs the cleaning fluid upward. The opening 43 directs the cleaning fluid upward from the plane of the rinse member 42 to assure the cup top 12 is cleaned. Other intermediate opening angles can be used to reach other desired inner surfaces of the catch cup. The openings 43 and plug 50 can be fabricated as described earlier in connection with FIG. 6A.

Figure 6D:
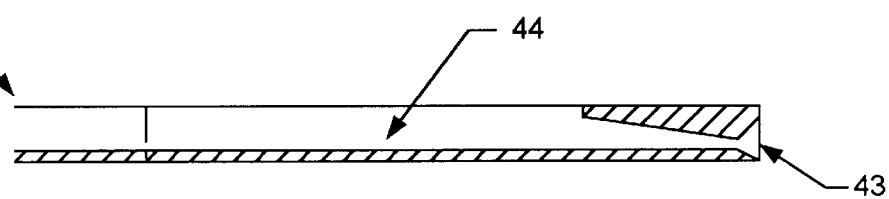
FIG. 6D is a cross-sectional drawing of the outer edge of the rinse member illustrating a diverging opening directing the cleaning fluid in a spray pattern.

FIG. 6D is an enlarged cross-sectional drawing of the outer edge of the rinse member 42 illustrating a diverging opening 43 to channel 44 which directs cleaning fluid in a spray pattern. The openings 43 can be fabricated as described earlier in connection with FIG. 6B.

Figure 6E:
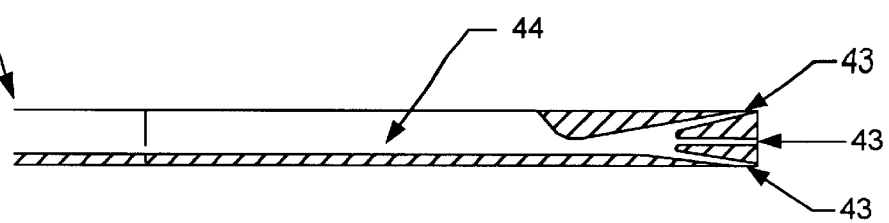
FIG. 6E is a cross-sectional drawing of the outer edge of the rinse member illustrating multiple openings directing the cleaning fluid in a spray pattern.

FIG. 6E is an enlarged cross-sectional drawing of the outer edge of the rinse member 42 illustrating a combination of opening angles directing the cleaning fluid upward, downward, and in the plane of the rinse member. The openings 43 can be fabricated as described earlier in connection with FIG. 6B.

In the embodiments shown in the FIGS. 6A–6E, each opening 43 is preferably 180 degrees apart. This assures the rinse member 42 is properly balanced during its rotation.

Preferred embodiments of the present invention have been described. Nevertheless, it will be understood that various modification may be made without departing from the scope of the invention. For example, the rinse member need not be disk or circular in shape as illustrated, but could be star-shaped, octogonal, pentagonal or any other shape which permits the placement of openings at the periphery of the rinse member. The present invention may not include a gasket as long as a fluid tight seal can be established between the cover and rinse member, and the cover and the rinse member may not be separate parts but one integral piece. The channels may be any shape that preferably increases the velocity of the cleaning fluid as it exits the rinse member from the centrifugal force. Thus, the channels may be of different shapes and sizes, and need not decrease in cross-sectional area from a inner location to the outer edge of the rinse member. Further, the channels may decrease in cross-sectional area in a non-linear manner.

What is claimed:

1. A cleaning system for placement on a spin chuck of a spin station used to coat a semiconductor wafer, wherein the system is disposed below a member for dispensing a cleaning fluid, comprising:

a rinse member, interchangeable with the semiconductor wafer, to be placed on the spin chuck for cleaning, wherein the rinse member includes a plurality of channels arranged in a star-shaped pattern extending from an inner location to an outer edge for delivery of the cleaning fluid through the channels during rotation of the rinse member; and a cover, disposed on the rinse member, below the member for dispensing cleaning fluid, wherein the cover includes an opening for entry of the cleaning fluid.

2. The system of claim 1, wherein the channels decrease in cross-sectional area from an inner location to the outer edge of the rinse member.

3. The system of claim 1 or 2, further comprising a gasket interposed between the cover and the rinse member to establish a fluid tight seal therebetween.

4. The system of claim 1, wherein the rinse member is disk-shaped and the dispensing member is a nozzle.

5. A system for dispensing cleaning fluid to a catch cup and adapted for use with a member for rotating a substrate and a dispensing member, comprising:

an integral member, interchangeable with the semiconductor wafer and placed on the rotating member, wherein the integral member includes a plurality of channels arranged in a star-shaped pattern extending from an inner opening to an outer edge of the rinse member, for the delivery of cleaning fluid through the channels during the rotation of the rinse member.

6. The system of claim 5, wherein the channel decreases in cross-sectional area from the inner opening to the outer edge of the rinse member.

7. The system of claim 5 or 6, further comprising a gasket forms a seal between the cover and the rinse member.

8. The system of claim 5 or 6, wherein the integral member is disks-shaped and the dispensing Member is a nozzle.

9. A cleaning system and semiconductor wafer spin station, wherein the cleaning system is disposed below a member for dispensing cleaning fluid, comprising:

a member for dispensing cleaning fluid;

a spin chuck disposed below the dispensing member;

a catch cup housing the spin chuck;

a rinse member, placed on the spin chuck and within the catch cup, wherein the rinse member includes a plurality of narrow channels arranged in a star-shaped pattern extending from an inner opening to an outer edge for delivery of the cleaning fluid through the channels during rotation of the rinse member; and a cover, disposed on the top surface of the rinse member and within the catch cup, and below the member for dispensing the cleaning fluid, wherein the cover includes an opening communicating with the inner opening for entry of the cleaning fluid.

10. A cleaning system and semiconductor wafer spin station, comprising:

a member for dispensing cleaning fluid;

a spin chuck disposed below the dispensing member;

a catch cup housing the spin chuck;

a rinse member, placed on the spin chuck and within the catch cup, including a plurality of channels arranged in a spiral-shaped pattern extending from an inner location to an outer edge for delivery of the cleaning fluid through the channels during rotation of the rinse member; and a cover, disposed on the top surface of the rinse member, wherein the cover includes an opening for entry of the cleaning fluid.

11. The system of claim 10, further comprising a robotic arm and a semiconductor wafer, wherein the rinse member and the cover are a cleaning system, and the robotic arm transfers the cleaning system and the semiconductor wafer on and off the spin chuck.

* * * * *